United States Patent
Sohn

(10) Patent No.: US 8,703,320 B2
(45) Date of Patent: Apr. 22, 2014

(54) BATTERY PACK HAVING THERMOELECTRIC DEVICE

(75) Inventor: Kwon Sohn, Suwon-si (KR)

(73) Assignees: Samsung SDI Co., Ltd., Yongin-Si, Gyeonggi-Do (KR); Robert Bosch GmbH, Stuttgart (DE)

( * ) Notice: Subject to any disclaimer, the term of this patent is extended or adjusted under 35 U.S.C. 154(b) by 625 days.

(21) Appl. No.: 12/805,523

(22) Filed: Aug. 4, 2010

(65) Prior Publication Data
US 2011/0183178 A1 Jul. 28, 2011

(30) Foreign Application Priority Data
Jan. 27, 2010 (KR) .................. 10-2010-0007462

(51) Int. Cl.
*H01M 10/50* (2006.01)

(52) U.S. Cl.
USPC .................. 429/120; 165/80.3; 165/104.33; 361/679.47; 361/679.52; 361/679.54

(58) Field of Classification Search
None
See application file for complete search history.

(56) References Cited

U.S. PATENT DOCUMENTS

| 5,229,702 A * | 7/1993 | Boehling et al. ............. 320/127 |
| 2005/0257532 A1 * | 11/2005 | Ikeda et al. .................. 62/3.7 |
| 2005/0287429 A1 * | 12/2005 | Cho et al. ................... 429/161 |
| 2006/0060236 A1 | 3/2006 | Kim |
| 2008/0292949 A1 * | 11/2008 | Shen et al. .................. 429/120 |
| 2009/0195988 A1 * | 8/2009 | Hongo ....................... 361/709 |

FOREIGN PATENT DOCUMENTS

| JP | 2001-143769 A | 5/2001 |
| JP | 2009-152440 A | 7/2009 |
| KR | 10 2005-0018518 A | 2/2005 |
| KR | 10 2006-0027578 A | 3/2006 |

* cited by examiner

*Primary Examiner* — Ula C Ruddock
*Assistant Examiner* — Tony Chuo
(74) *Attorney, Agent, or Firm* — Lee & Morse, P.C.

(57) ABSTRACT

A battery pack includes a secondary battery, an outer case receiving the secondary battery, and a cooling unit disposed at a predetermined position of the outer case, wherein the cooling unit includes a first heatsink disposed toward the inside of the outer case, a second heatsink disposed toward the outside of the outer case, and a thermoelectric device between the first heatsink and the second heatsink.

6 Claims, 8 Drawing Sheets

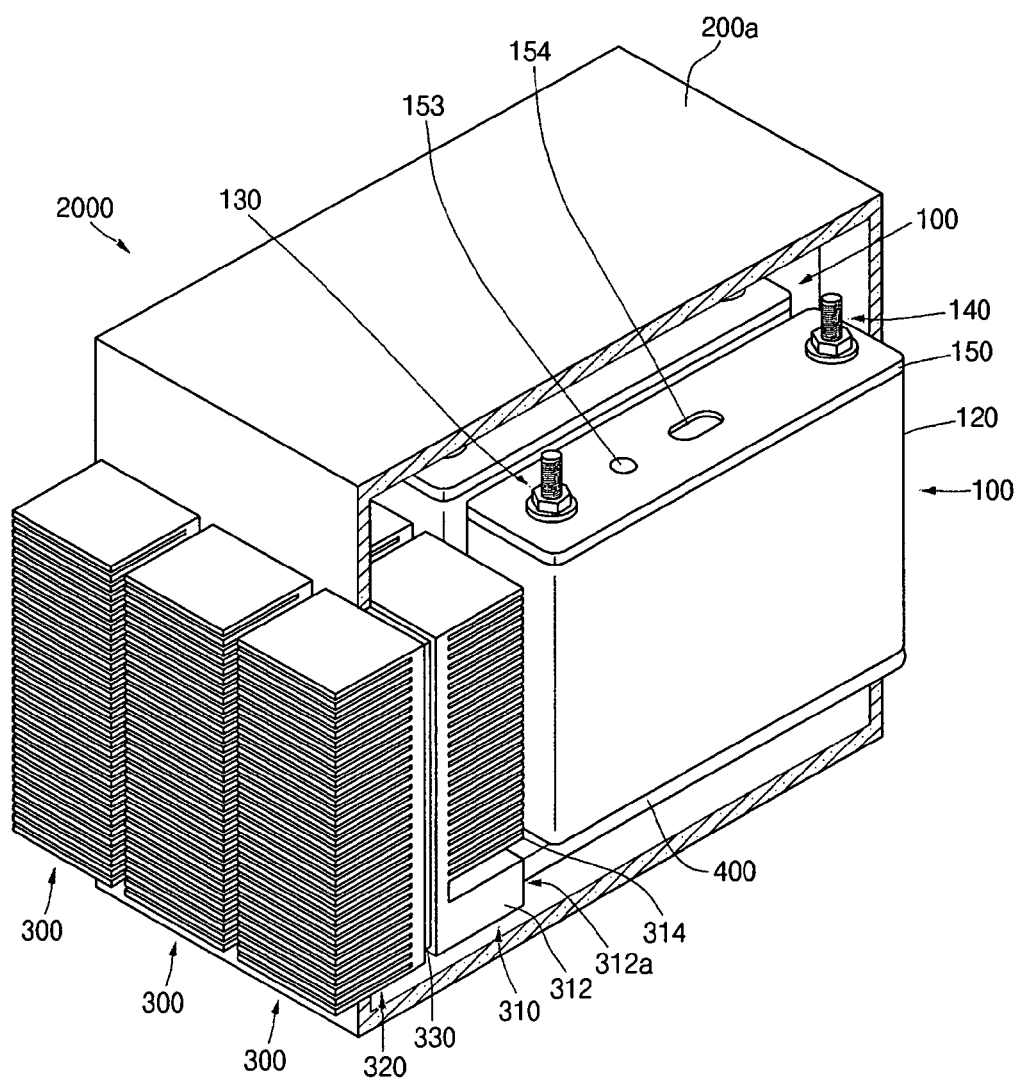

BATTERY PACK HAVING THERMOELECTRIC DEVICE

BACKGROUND

1. Field

Embodiments relate to a battery pack.

2. Description of the Related Art

Recently, as electronics industries, communication industries, and computer industries have rapidly developed, portable electronics are being widely used. Rechargeable secondary batteries are being widely used as power sources for such portable electronics.

A secondary battery including one cell may be sufficient to power small-sized electronics such as a mobile phone. However, to provide sufficient power or capacity to middle- or large-sized devices such as notebook computers, electric tools, electric and hybrid electric vehicles such as bicycles, cars, etc., a battery pack in which a plurality of secondary batteries are connected to each other in parallel and/or series may be used. Such a battery pack may generate a large amount of heat.

SUMMARY

It is a feature of an embodiment to provide a battery pack having improved cooling efficiency.

It is another feature of an embodiment to provide a battery pack that may be cooled by convection using a heatsink pin and a thermoelectric device.

It is another feature of an embodiment to provide a battery pack that may be cooled by conduction using a heat pipe, a heatsink pin, and a thermoelectric device.

At least one of the above and other features and advantages may be realized by providing a battery pack including a secondary battery, an outer case receiving the secondary battery, and a cooling unit disposed at a predetermined position of the outer case. The cooling unit may include a first heatsink disposed toward the inside of the outer case, a second heatsink disposed toward the outside of the outer case, and a thermoelectric device between the first heatsink and the second heatsink.

The battery pack may further include a heat pipe attached to a bottom surface of the secondary battery.

The heat pipe may have a pipe shape having a surface corresponding to the bottom surface of the secondary battery.

An end of a side of the heat pipe may contacts the first heatsink.

An end of a side of the heat pipe may be inserted into at least one heatsink pin of the first heatsink.

The outer case may receive at least two secondary batteries therein.

The secondary batteries may be spaced a predetermined distance from each other, arranged in a plurality of layers, and received in the outer case.

The secondary batteries may be spaced a predetermined distance from each other, arranged in a plurality of rows and layers, and received in the outer case.

The secondary battery may include an electrode assembly, a can receiving the electrode assembly, and a cap plate covering the can. The electrode assembly may include a first electrode plate, a second electrode plate, and a separator disposed between the first electrode plate and the second electrode plate to insulate the first electrode plate from the second electrode plate, and the first electrode plate, the second electrode plate, and the separator may be wound.

The first electrode plate may include a first non-coated portion on which a first active material is not coated, and the second electrode plate includes a second non-coated portion on which a second active material is not coated, and the first non-coated portion may protrude through one side of the separator and the second non-coated portion may protrude through another side of the separator so as to protrude in directions opposite to each other.

The secondary battery may include a first electrode terminal connected to the first non-coated portion, and a second electrode terminal connected to the second non-coated portion. The first electrode terminal may include a first extension part connected to the first non-coated portion, a first bolt part passing through the cap plate to protrude to the outside of the secondary battery, and a second extension part connecting the first extension part to the first bolt part, and the second electrode terminal may include a third extension part connected to the second non-coated part, a second bolt part passing through the cap plate to protrude to the outside of the secondary battery, and a fourth extension part connecting the third extension part to the second bolt part.

BRIEF DESCRIPTION OF THE DRAWINGS

The above and other features and advantages will become more apparent to those of skill in the art by describing in detail example embodiments with reference to the attached drawings, in which:

FIG. 5 illustrates a view of a battery pack according to another embodiment;

DETAILED DESCRIPTION

Figure 1:
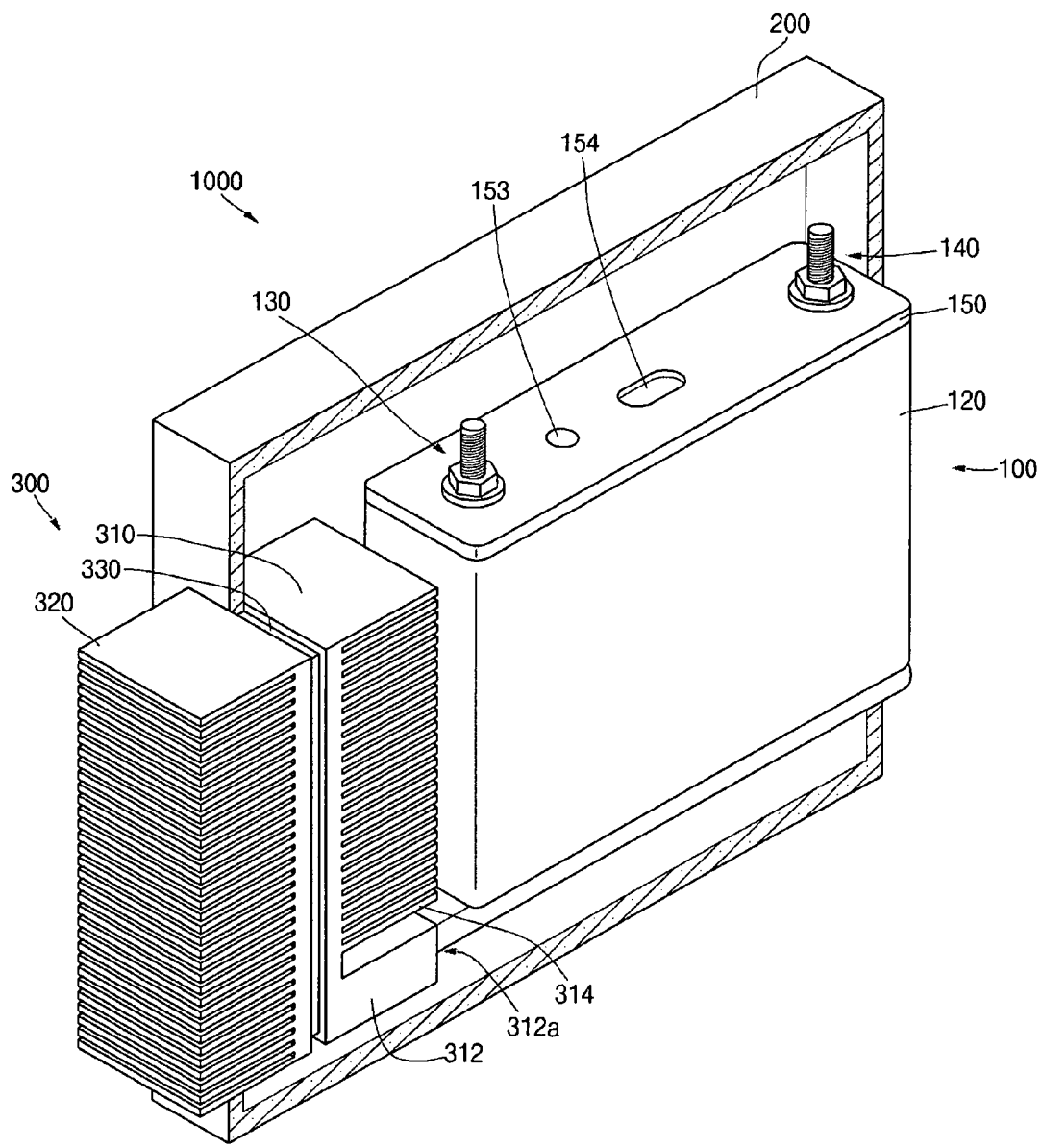
FIG. 1 illustrates a view of a battery pack according to an embodiment.

Korean Patent Application No. 10-2010-0007462, filed on Jan. 27, 2010, in the Korean Intellectual Property Office, and entitled: "Battery Pack," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the disclosure to those skilled in the art.

In the drawing figures, the dimensions of layers and regions may be exaggerated for clarity of illustration. Like reference numerals refer to like elements throughout.

Figure 2:
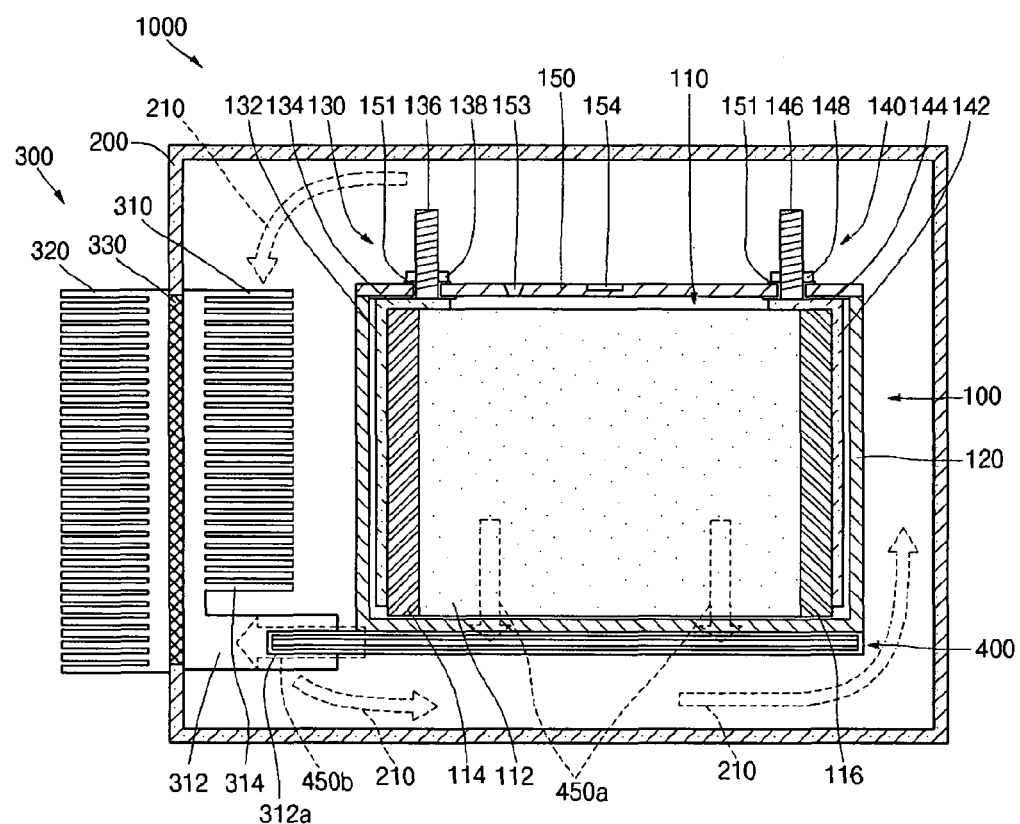
FIG. 2 illustrates a schematic view of a cooling process of a battery pack according to the embodiment.
Figure 3:
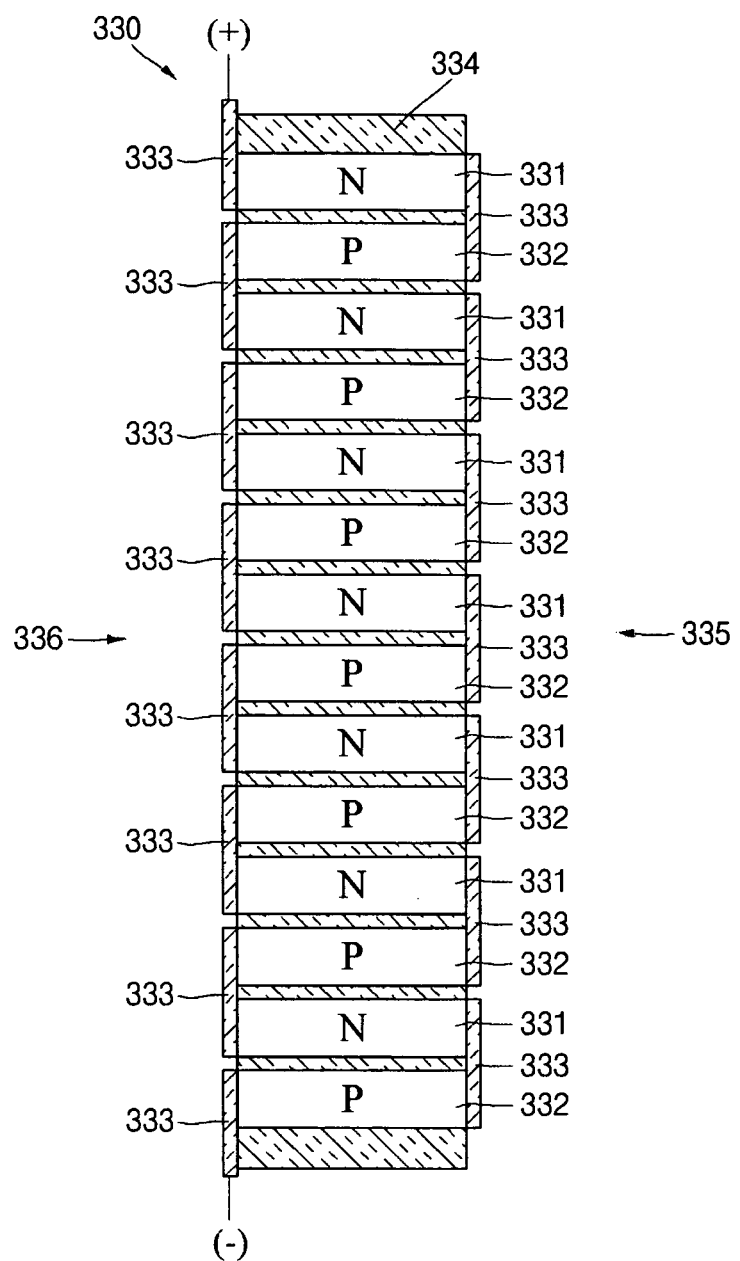
FIG. 3 illustrates a schematic view of a thermoelectric device part of a battery pack according to the embodiment.
Figure 4A:
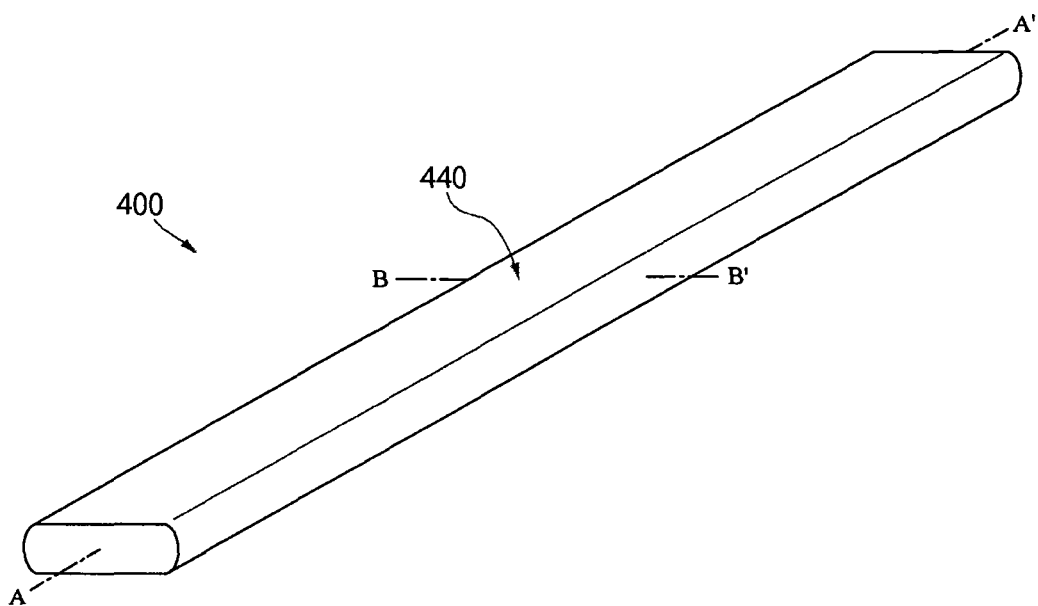
FIG. 4A illustrates a view of a heat pipe part of a battery pack according to the embodiment.
Figure 4B:
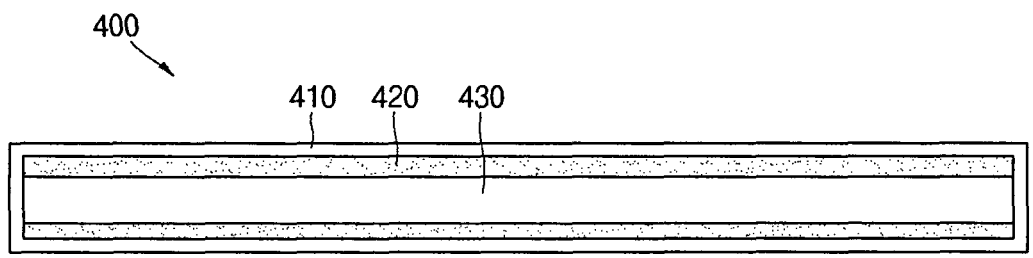
FIG. 4B illustrates a sectional view taken along line A-A' of FIG. 4A.
Figure 4C:
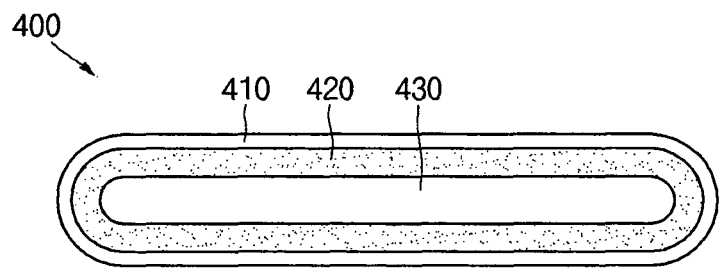
FIG. 4C illustrates a sectional view taken along line B-B' of FIG. 4A.

FIG. 1 illustrates a view of a battery pack 1000 according to an embodiment, and FIG. 2 illustrates a schematic view of a cooling process of a battery pack according to the embodiment. FIG. 3 illustrates a schematic view of a thermoelectric device part of a battery pack according to the embodiment, and FIG. 4A illustrates a view of a heat pipe part of a battery pack according to the embodiment. FIG. 4B illustrates a sectional view taken along line A-A' of FIG. 4A, and FIG. 4C illustrates a sectional view taken along line B-B' of FIG. 4A.

Referring to FIGS. 1 through 4, the battery pack 1000 may include a secondary battery 100, an outer case 200, a cooling unit 300, and a heat pipe 400.

The second battery 100 may include an electrode assembly 110, a can 120, a first electrode terminal 130, a second electrode terminal 140, and a cap plate 150.

The electrode assembly 110 may include a first electrode plate, a separator 112, and a second electrode plate. The electrode assembly 110 may be wound in an approximately jelly-roll type. The first electrode plate may be a positive electrode plate and the second electrode plate may be a negative electrode plate. In another implementation, the first electrode plate may be a negative electrode plate and the second electrode plate may be a positive electrode plate.

The first electrode plate may include a first metal foil and a first active material. When the first electrode plate is the positive electrode plate, the first metal foil may be formed of aluminum, and the first active material may be a lithium-based oxide.

The second electrode plate may include a second metal foil and a second active material. When the second electrode plate is the negative electrode plate, the second metal foil may be formed of copper, and the second active material may be graphite.

The separator 112 may be formed of materials such as porous polyethylene (PE) and polypropylene (PP) or its equivalent, etc. The separator 112 may be substantially disposed on both side surfaces of the first electrode plate or the second electrode plate.

The first electrode plate may include a first non-coated portion 114, on which a positive electrode active material is not coated. The first non-coated portion 114 may protrude to the outside through one side of the separator 112.

The second electrode plate may include a second non-coated portion 116, on which a negative electrode active material is not coated. The second non-coated portion 116 may protrude to the outside through the other side of the separator 112. Thus, the first non-coated portion 114 and the second non-coated portion 116 may protrude in direction opposite to each other.

The can 120 may include a bottom surface 122 and side surfaces extending from the bottom surface 122. The can 120 may have an open upper portion. The electrode assembly 110 together with an electrolyte may be received into the can 120 via the open upper portion. The can 120 may be formed of materials such as aluminum, copper, iron, stainless steel (SUS), ceramic, polymer, and equivalents thereof, etc. The can 120 may be substantially electrically connected to any one of the first electrode plate or the second electrode plate. Thus, the can 120 may have either positive polarity or negative polarity.

The first electrode terminal 130 and the second electrode terminal 140 may be electrically connected to the first electrode plate and the second electrode plate of the electrode assembly 110, respectively. For example, the first electrode terminal 130 may be welded to the first electrode plate, and the second electrode terminal 140 may be welded to the second electrode plate. Particularly, the first electrode terminal 130 may be welded to the first non-coated portion 114 of the first electrode plate. Also, the second electrode terminal 140 may be welded to the second non-coated portion 116 of the second electrode plate.

The first electrode terminal 130 may include a first extension part 132, a second extension part 134, and a first bolt part 136. The first extension part 132 may be connected to the first non-coated portion 114. The second electrode terminal 140 may include a third extension part 142, a fourth extension part 144, and a second bolt part 146. The third extension part 142 may be connected to the second non-coated portion 116. The bolt parts 136 and 146 of the first electrode terminal 130 and the second electrode terminal 140 may protrude to the outside through the cap plate 150.

The cap plate 150 may be configured to allow the first electrode terminal 130 and the second electrode terminal 140 to protrude to the outside, as well as to cover the can 120. A boundary or joint between the cap plate 150 and the can 120 may be welded, e.g., using a laser. Each of the bolt parts 136 and 146 of the first electrode terminal 130 and the second electrode terminal 140 may pass through the cap plate 150, and insulating materials 151 and 152 may be respectively disposed on outer circumference of the bolt parts 136 and 146. Thus, the first electrode terminal 130 and the second electrode terminal 140 may be electrically insulated from the cap plate 150 using the insulating materials 151 and 152. In another implementation, one of the first electrode terminal 130 and the second electrode terminal 140 may directly contact and pass through the cap plate 150 without using the insulating material 151 or 152. For example, the bolt part 136 of the first electrode terminal 130 may not be covered by the insulating material 151, and the bolt part 136 of the first electrode terminal 130 may directly contact the cap plate 150. In this case, the cap plate 150 and the can 120 have the same polarity as the first electrode terminal 130.

Nuts 138 and 148 may be coupled to the bolt parts 136 and 146 of the first electrode terminal 130 and the second electrode terminal 140, respectively. The first electrode terminal 130 and the second electrode terminal 140 may be firmly fixed to the cap plate 150 using the nuts 138 and 148. An electrolyte plug 153 may be coupled to the cap plate 150. A safety vent 154 having a relatively thin thickness may be disposed on the cap plate 150. The cap plate 150 may be formed of the same material as the can 120.

The secondary battery 100 may be received into the outer case 200. A portion of the outer case 200 is omitted in FIG. 1, i.e., a cut-away illustration is provided, in order to illustrate a state in which the secondary battery 100 is received into the outer case 200. The outer case 200 may have a structure such that it can receive the secondary battery 100 therein to seal the secondary battery 100 against the outside.

The cooling unit 300 may include a first heatsink 310, a second heatsink 320, and a thermoelectric device 330.

The first heatsink 310 may be disposed within the outer case 200 and may include at least one heatsink pin 312 that absorbs heat within the outer case 200.

The heatsink pin 312 is described in detail with reference to FIG. 2. Two or more heatsink pins 312 may be provided. A first heatsink pin 312 may contact a heat pipe 400 that will be described later. The first heatsink pin 312 contacting the heat pipe 400 may directly absorb heat from the heat pipe 400 or absorb heat by conduction.

Referring to FIG. 2, the first heatsink pin 312 may have an insertion groove 312a. The insertion groove 312a may receive an end 410 of a side of the heat pipe 400 so as to widen a contact area between the first heatsink pin 312 and the heat pipe 400, thereby further effectively absorbing a large amount of the heat.

Another of the heatsink pins 312, here referred to as a second heatsink pin 314, may be disposed toward the inside of the outer case 200. Many such heatsink pins may be provided.

The second heatsink pin 314 disposed toward the inside of the outer case 200 absorbs the heat within the outer case 200. Since the second heatsink pin 314 absorbs the heat within the outer case 200, convection (indicated by dashed arrows 210) may occur inside the outer case 200. The secondary battery 100 may be easily cooled due to the convection.

The second heatsink 320 may be disposed toward the outside of the outer case 200. The second heatsink 320 may include at least one heatsink pin 322, e.g., a plurality of heatsink pins 322, that radiate heat (conducted through the first heatsink 310 and the thermoelectric device 330) to the outside.

The thermoelectric device 330 may be disposed between the first heatsink 310 and the second heatsink 320. The thermoelectric device 330 may transmit the heat absorbed from the first heatsink pin 312 and the second heatsink pin 314 of the first heatsink 310 to the second heatsink 320.

Referring to FIG. 3, an example implementation of the thermoelectric device 330 includes an N-type semiconductor 331, a P-type semiconductor 332, a metal interconnection 333, and an insulating material 334. The N-type semiconductor 331 and the P-type semiconductor 332 are connected to each other in series by the metal interconnection 333. The N-type semiconductor 331 and the P-type semiconductor 332 absorb or radiate heat into/from one surface 335 and the other surface 336 according to a direction of current flowing through the metal interconnection 333. For example, as shown in FIG. 3, in case of the thermoelectric device 330 in which a negative (−) terminal is connected to an upper portion thereof and a positive (+) terminal is connected to a lower portion thereof, the heat is absorbed into the one surface 335 and radiated from the other surface 336. The insulating material 334 thermally insulates the thermoelectric device 330.

Referring again to FIG. 2, the heat pipe 400 may be attached to a bottom surface 122 of the secondary battery 100. As shown in FIGS. 4A through 4C, the heat pipe 400 may include a container 410 protecting the inside thereof and formed of a material having a high thermal conductivity.

In an example implementation, the heat pipe 400 also includes a wick 420 disposed within the container 410 and formed of a porous material. An inner space 430 defined inside the wick 420 is an empty space having a low pressure. A plurality of surface pores are defined in a surface of the wick 420 facing the inner space 430. Also, the wick 420 has an inner fine pore therein to easily circulate condensate circulating the inside of the wick 420.

The heat pipe 400 may have a pipe shape having a surface 440 corresponding to the bottom surface of the secondary battery 100, in order to maximize the contact area between the heat pipe 400 and the bottom surface 122 of the secondary battery 100 and thereby allow the heat pipe 400 to effectively absorb the heat from the secondary battery 100. Referring again to FIG. 2, the heat pipe 400 may directly absorb the heat generated within the secondary battery 100 (see reference numeral 450a representing the heat) and directly transmits the absorbed heat to the first heatsink pin 312 of the cooling unit 300 (see reference numeral 450b) to effectively cool the secondary battery 100.

As described above, the battery pack 1000 may include the outer case 200 receiving the secondary battery 100, the cooling unit 300 disposed at a predetermined position of the outer case 200, and the heat pipe 400 attached to the bottom surface 122 of the secondary battery 100. The end of the heat pipe 400 may contact the cooling unit 300 to cool the heat generated in the secondary battery 100 by the conduction. Convection may occur inside the outer case 200 as a result of the cooling unit 300 to cool the heat generated in the secondary battery 100 by the convection, thereby effectively cooling the secondary battery 100 disposed within the outer case 200.

FIG. 5 illustrates a view of a battery pack 2000 according to another embodiment.

Referring to FIG. 5, the battery pack 2000 is different from the battery pack 1000 in that the battery pack 2000 includes a plurality of secondary batteries 100 disposed within an outer case 200a, and cooling units 300 and heat pipes corresponding to the secondary batteries 100 are provided in plurality. Thus, descriptions with respect to the same components as describe above in connection with the battery pack 1000 will be omitted to avoid repetition.

The battery pack 2000 may include a plurality of secondary batteries 100. As shown in FIG. 5, the secondary batteries 100 may be arranged in a line. In another implementation (not shown in FIG. 5), the secondary batteries 100 may be arranged in a plurality of rows. Also, as for other embodiments described below, the secondary batteries 100 may be arranged in a plurality of layers and in a plurality of rows.

Figure 6:
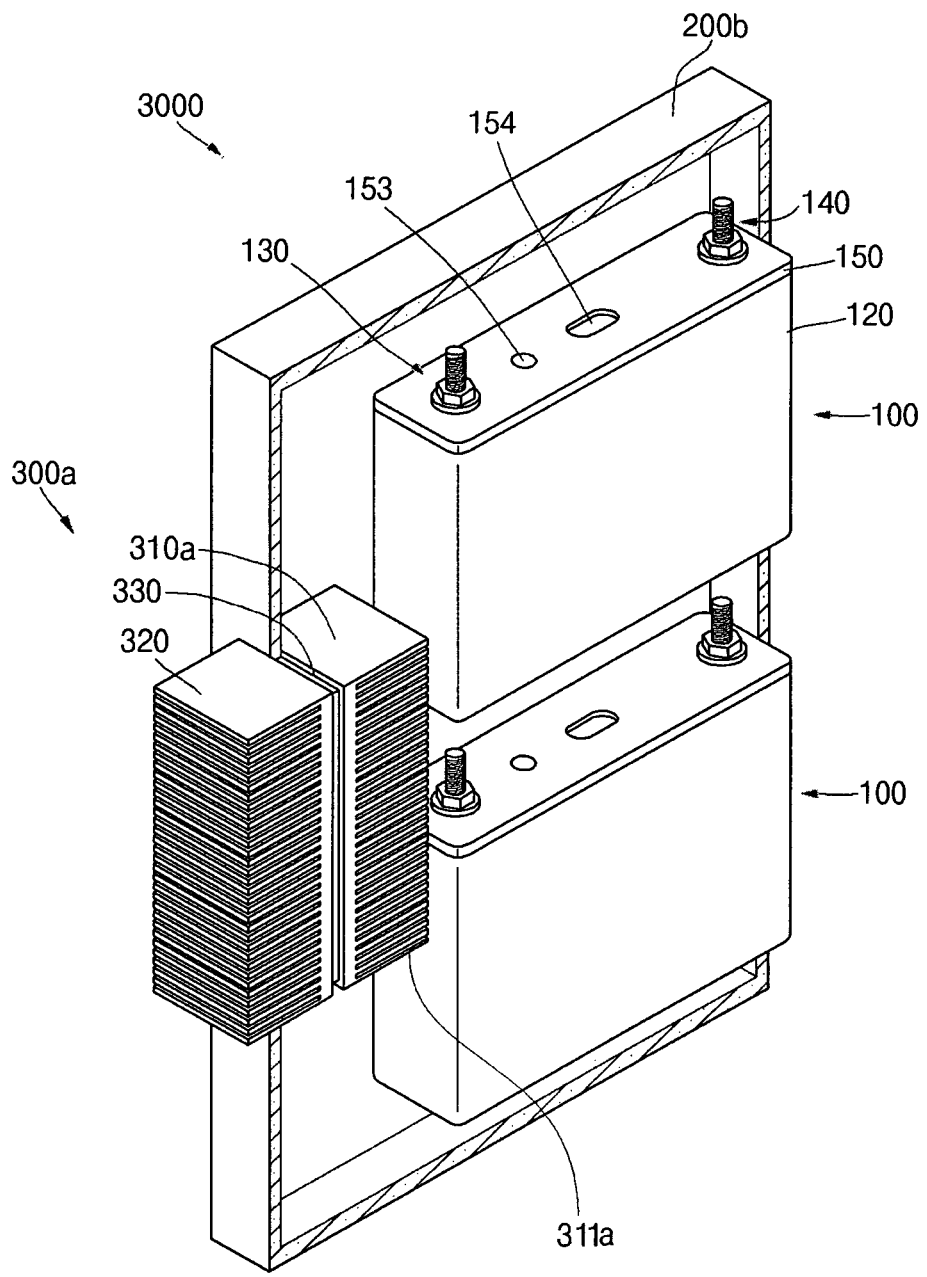
FIG. 6 illustrates a view of a battery pack according to yet another embodiment.
Figure 7:
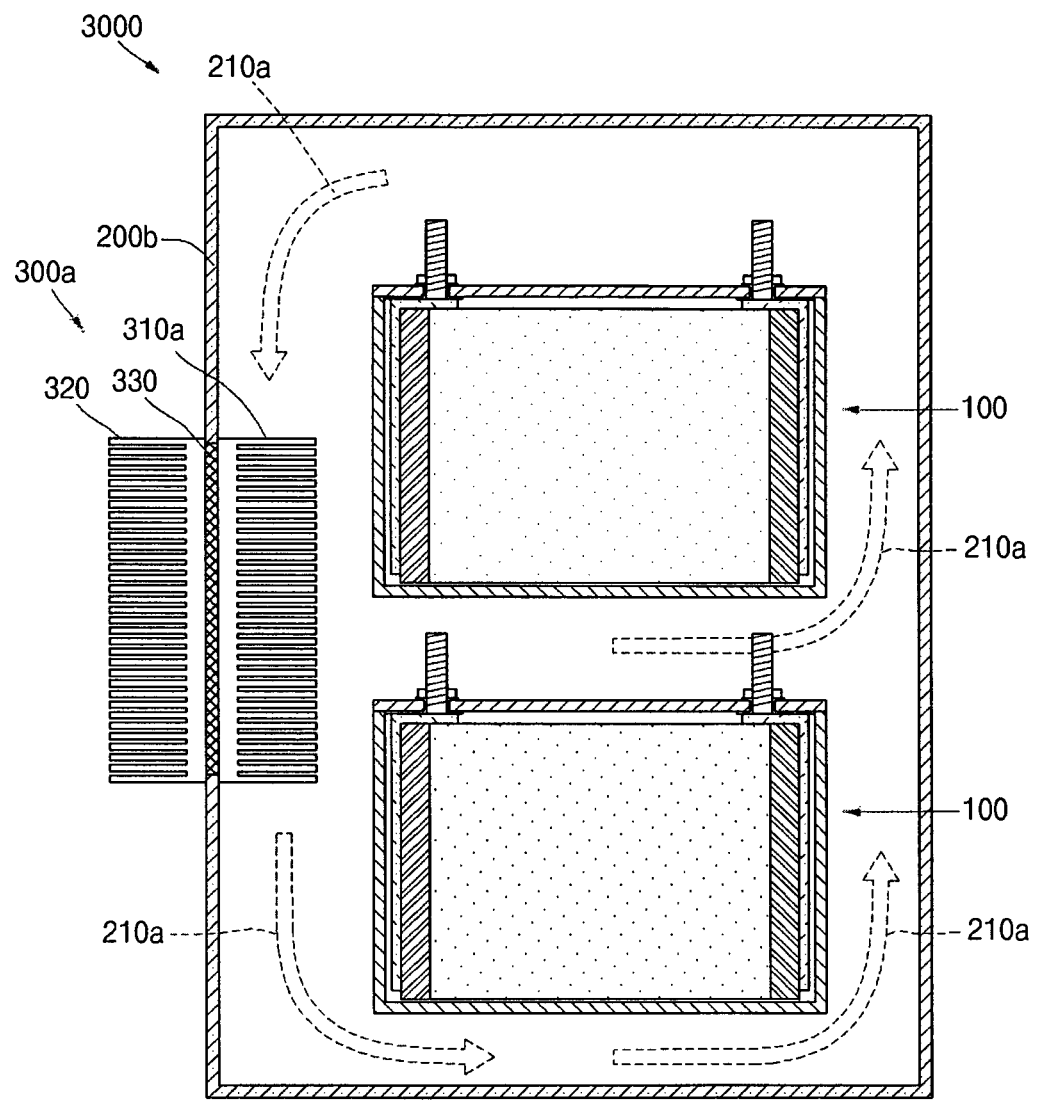
FIG. 7 illustrates a schematic view of a cooling process of a battery pack illustrated in FIG. 6.

FIG. 6 illustrates a view of a battery pack 3000 according to yet another embodiment, and FIG. 7 illustrates a schematic view of a cooling process of a battery pack illustrated in FIG. 6.

Referring to FIGS. 6 and 7, the battery pack 3000 may include a secondary battery 100, an outer case 200b, and a cooling unit 300a. The secondary battery 100 has the same structure and configuration as the secondary battery 100 of the battery pack 1000 described above with reference to FIGS. 1 through 4C, and thus the description thereof will be omitted.

The battery pack 3000 is different from the battery packs 1000 and 2000 in that the battery pack 3000 includes two or more secondary batteries 100. Here, the second batteries are provided with a plurality of layers. The outer case 200b has a sufficient size to receive the secondary batteries 100.

Referring to FIG. 7, the secondary batteries 100 may be disposed spaced a predetermined distance from each other inside the outer case 200b to allow gas within the outer case 200b to be convected within the outer case 200b. That is, the outer case 200b has a size to allow the gas within the outer case 200b to be convected (see reference numeral 210a) between the secondary batteries 100 and between the respective secondary batteries 100 and the outer case 200b.

The cooling unit 300a may be similar to the cooling unit 300 described with reference to FIGS. 1 through 4C, except that the cooling unit 300a may omit the first heatsink pin 312 contacting the heat pipe 400. The cooling unit 300a may include a first heatsink 300a, a second heatsink 320, and a thermoelectric device 330. The second heatsink 320 and the thermoelectric device 330 may have the same structure and configuration as those 320 and 330 of the cooling unit 300 described with reference to FIGS. 1 through 4C, and thus their descriptions will be omitted.

As shown in FIG. 6, the first heatsink 310a of the cooling unit 300a may include at least one heatsink pin 311a disposed facing the inside of the outer case 200b. The at least one heatsink pin 311a performs the same function as the second heatsink pin 312 of the first heatsink 310 of the cooling unit 300 described with reference to FIGS. 1 through 4C, absorbing heat within the outer case 200b. Thus, as shown in FIG. 7, convection may occur inside the outer case 200b to easily cool the secondary batteries 100.

As described above, the battery pack 3000 may include at least two secondary batteries 100, the outer case 200b in which the secondary batteries 100 are spaced a predetermined distance from each other and from the outer case 200*b*, and the cooling unit 300*a* disposed at a predetermined position of the outer case 200*b*. The first heatsink 310*a* of the cooling unit 300*a* may absorb the heat within the outer case 200*b*, and the second heatsink 320 may radiate the heat transmitted from the first heatsink 310 through the thermoelectric device 300 to cool the inside of the outer case 200*b*. Convection (indicated by dashed arrows 210*a* in FIG. 7) may occur inside by the cooling of the inside of the outer case 200*b* to effectively cool the secondary batteries due to the convection.

Figure 8:
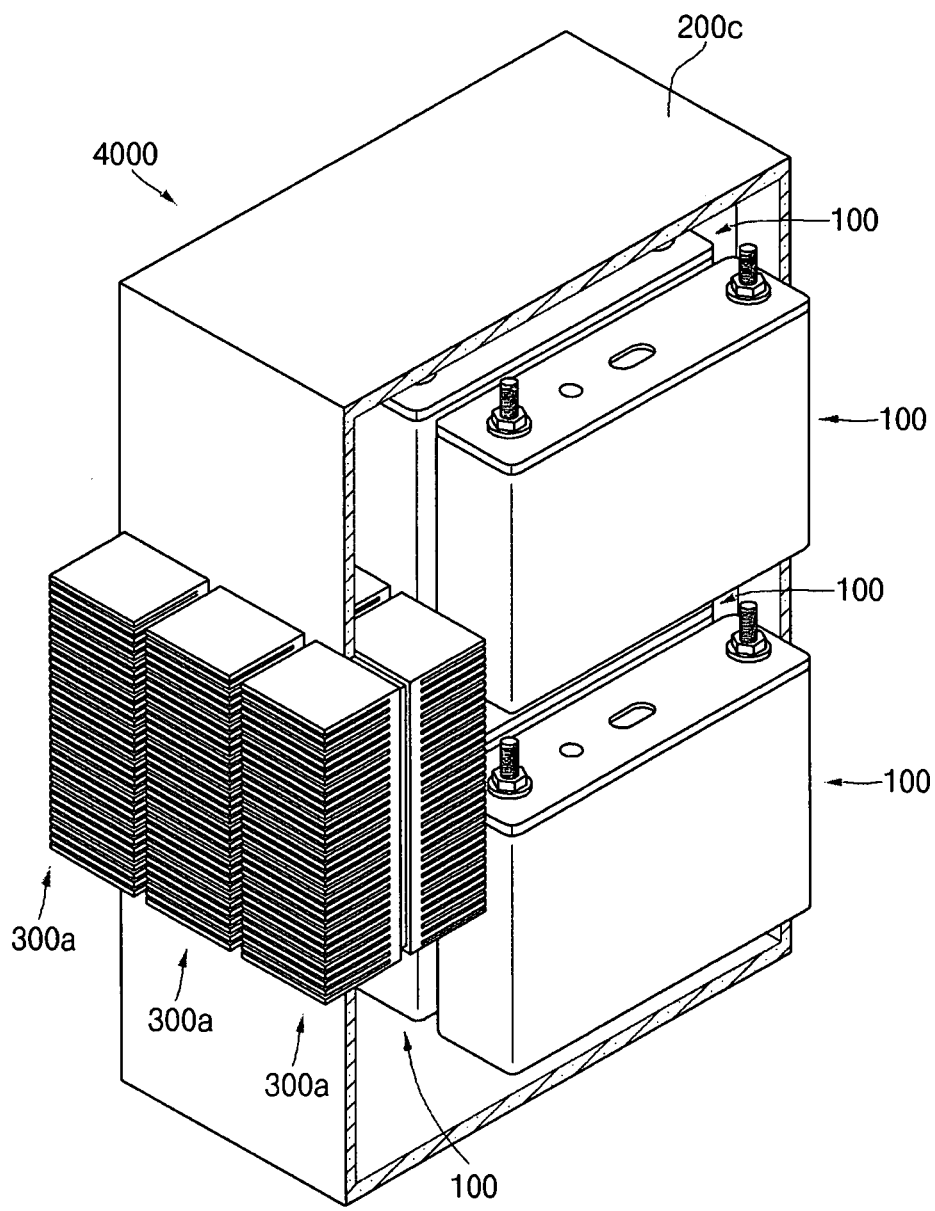
FIG. 8 illustrates a view of a battery pack according to yet another embodiment.

FIG. 8 illustrates a view of a battery pack 4000 according to yet another embodiment.

Referring to FIG. 8, the battery pack 4000 is different from the battery pack 3000 in that the battery pack 4000 includes a plurality of secondary batteries 100 arranged in a plurality of rows and layers, and a plurality of cooling units 300*a* are provided.

The battery pack 4000 may include a plurality of secondary batteries 100, an outer case 200*c*, and a cooling unit 300*a*. The secondary batteries 100 have the same constitution as the secondary battery 100 described with reference to FIGS. 1 through 4C, and thus, their detailed descriptions will be omitted.

The battery pack 4000 may include the plurality of secondary batteries 100 arranged in a plurality of rows and layers. Thus, as shown in FIG. 8, the secondary batteries 100 may be arranged in two or more rows and two or more layers. This configuration is provided to effectively cool the secondary batteries 100 using the convection phenomenon 210*a* described with reference to FIGS. 6 and 7.

The outer case 200*c* may have a size such that the plurality of secondary batteries 100 are arranged in the plurality of rows and layers, and spaced from a predetermined distance from each other and from the outer case 200*c*.

The cooling unit 300*a* may have the same constitution as the cooling unit 300*a* described with reference to FIGS. 6 and 7 except that the cooling unit 300*a* of this embodiment is provided in plurality for further effectively cooling the inside of the battery pack 4000. However, if cooling efficiency of the cooling unit 300*a* is high, one cooling unit 300*a* may be provided.

As described above, embodiments may provide a battery pack having improved cooling efficiency. Also, according to the embodiments, the battery pack may be cooled by convection using the heatsink pin(s) and the thermoelectric device. Also, according to the embodiments, the battery pack may be cooled by conduction using the heat pipe, the heatsink pin, and the thermoelectric device.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A battery pack, comprising:
   a secondary battery;
   an outer case receiving the secondary battery;
   a cooling unit disposed at a predetermined position of the outer case, the cooling unit including a first heatsink disposed toward the inside of the outer case, a second heatsink disposed toward the outside of the outer case, and a thermoelectric device between the first heatsink and the second heatsink; and
   a heat pipe attached to a bottom surface of the secondary battery, wherein:
   the first heatsink includes at least two heatsink pins, a first heatsink pin including only one heatsink pin and a second heatsink pin including at least one heatsink pin, and
   an end of a side of the heat pipe being inserted into only the first heatsink pin of the first heatsink.

2. The battery pack as claimed in claim 1, wherein the heat pipe has a pipe shape having a surface corresponding to the bottom surface of the secondary battery.

3. The battery pack as claimed in claim 1, wherein the outer case receives at least two secondary batteries therein.

4. The battery pack as claimed in claim 1, wherein the secondary battery comprises:
   an electrode assembly;
   a can receiving the electrode assembly; and
   a cap plate covering the can, wherein:
   the electrode assembly includes a first electrode plate, a second electrode plate, and a separator disposed between the first electrode plate and the second electrode plate to insulate the first electrode plate from the second electrode plate, and
   the first electrode plate, the second electrode plate, and the separator are wound.

5. The battery pack as claimed in claim 4, wherein:
   the first electrode plate includes a first non-coated portion on which a first active material is not coated, and the second electrode plate includes a second non-coated portion on which a second active material is not coated, and
   the first non-coated portion protrudes through one side of the separator and the second non-coated portion protrudes through another side of the separator so as to protrude in directions opposite to each other.

6. The battery pack as claimed in claim 5, wherein the secondary battery comprises:
   a first electrode terminal connected to the first non-coated portion; and
   a second electrode terminal connected to the second non-coated portion, wherein:
   the first electrode terminal includes:
      a first extension part connected to the first non-coated portion;
      a first bolt part passing through the cap plate to protrude to the outside of the secondary battery; and
      a second extension part connecting the first extension part to the first bolt part, and
   the second electrode terminal includes:
      a third extension part connected to the second non-coated part;
      a second bolt part passing through the cap plate to protrude to the outside of the secondary battery; and
      a fourth extension part connecting the third extension part to the second bolt part.

\* \* \* \* \*